US008228061B2

(12) United States Patent
Griswold et al.

(10) Patent No.: US 8,228,061 B2
(45) Date of Patent: Jul. 24, 2012

(54) MITIGATING OFF-RESONANCE ANGLE IN STEADY-STATE COHERENT IMAGING

(76) Inventors: Mark A. Griswold, Shaker Heights, OH (US); Jeremiah Heilman, University Heights, OH (US)

( * ) Notice: Subject to any disclaimer, the term of this patent is extended or adjusted under 35 U.S.C. 154(b) by 582 days.

(21) Appl. No.: 12/407,872

(22) Filed: Mar. 20, 2009

(65) Prior Publication Data
US 2010/0237862 A1 Sep. 23, 2010

(51) Int. Cl.
*G01V 3/00* (2006.01)
(52) U.S. Cl. .......................... 324/307; 324/309; 324/318
(58) Field of Classification Search .......... 324/300–322; 382/128–131; 600/407–435
See application file for complete search history.

(56) References Cited

U.S. PATENT DOCUMENTS

| | | | | |
|---|---|---|---|---|
| 2,878,443 A * | 3/1959 | Schuster | ...................... | 324/314 |
| 6,307,368 B1 * | 10/2001 | Vasanawala et al. | ......... | 324/309 |
| 6,794,870 B2 * | 9/2004 | Hennig | ........................ | 324/309 |
| 7,259,558 B2 * | 8/2007 | Bieri et al. | .................... | 324/309 |
| 7,279,899 B2 * | 10/2007 | Michaeli et al. | ............. | 324/318 |
| 7,372,266 B2 * | 5/2008 | Markl et al. | ................... | 324/307 |
| 7,474,097 B2 * | 1/2009 | Bydder et al. | ................. | 324/307 |
| 8,072,211 B2 * | 12/2011 | Harvey | ......................... | 324/309 |
| 2006/0125476 A1 * | 6/2006 | Markl et al. | ................... | 324/307 |
| 2006/0152219 A1 * | 7/2006 | Bieri et al. | .................... | 324/309 |
| 2008/0018332 A1 * | 1/2008 | Lieblich et al. | ............... | 324/300 |
| 2009/0079427 A1 * | 3/2009 | Deimling | ...................... | 324/307 |
| 2009/0275822 A1 * | 11/2009 | Detsky et al. | ................. | 600/413 |
| 2009/0322331 A1 * | 12/2009 | Buracas | ........................ | 324/309 |
| 2010/0237862 A1 * | 9/2010 | Griswold et al. | ............. | 324/309 |
| 2010/0264920 A1 * | 10/2010 | Witschey et al. | ............. | 324/309 |
| 2010/0312095 A1 * | 12/2010 | Jenkins et al. | ................ | 600/411 |
| 2011/0128000 A1 * | 6/2011 | Harvey | ......................... | 324/307 |
| 2011/0144474 A1 * | 6/2011 | Ouwerkerk | ................... | 600/410 |
| 2011/0181282 A1 * | 7/2011 | Dannels | ........................ | 324/309 |

* cited by examiner

*Primary Examiner* — Melissa Koval
*Assistant Examiner* — Tiffany Fetzner (57) ABSTRACT

Systems, methods, and other embodiments associated with mitigating off-resonance angle in steady-state coherent magnetic resonance imaging (MRI) are described. One example method includes accessing a B0 map and a coil sensitivity profile associated with an MRI apparatus configured to produce a steady-state coherent MRI sequence to image an object. The MRI apparatus is configured with a multi-channel transmission array having individually controllable transmission channels. The method includes computing transmission control parameters for individual transmission channels as a function of the B0 map and the coil sensitivity profile. The transmission control parameters are configured to facilitate controlling the transmission array to create a spatially varying phase profile using a single dimensional radio frequency (RF) pulse.

14 Claims, 8 Drawing Sheets

MITIGATING OFF-RESONANCE ANGLE IN STEADY-STATE COHERENT IMAGING

BACKGROUND

Steady-state coherent magnetic resonance imaging (MRI) involves fast sequences that yield an excellent signal to noise ratio (SNR) and a unique contrast. TrueFISP (True fast imaging with steady-state precession), which is also known as bSSFP (balanced steady-state free precession), is one example fast steady-state coherent MRI technique. Steady-state coherent MRI has historically been sensitive to variations in the B0 field. Variations in the B0 field may lead to phase accumulation in steady-state coherent MRI.

Phase accumulation may also be referred to as the "off-resonance angle" that causes spins in some locations in an object being imaged to become parallel with a radio frequency (RF) field employed during the steady-state coherent MRI. When the spins become parallel to the field, those spins will not experience desired excitation due to the pulse sequence. Spins that are not excited will not produce the correct level of nuclear magnetic resonance (NMR) signal from which a magnetic resonance (MR) image can be formed. Therefore, the regions where the spins are not excited will appear as dark bands in an MR image. More particularly, continuous signal voids may appear in an MR image at locations where the off-resonance angle is an odd-integer multiple of π. The continuous signal voids may lead to the dark bands, which in turn may obstruct underlying pathology, which is undesirable.

Conventional attempts to address phase accumulation and the off-resonance angle issue have included shimming and multi-dimensional pulses. However, neither of these approaches has provided desired mitigation of banding effects associated with phase accumulation. Shimming is a mature technology and recent efforts have tended to produce only incremental improvements. Additionally, shimming may be limited in its ability to adapt to certain B0 situations. Multi-dimensional pulses have also conventionally been employed to mitigate phase accumulation. Tailored multi-dimensional pulses may mitigate some issues associated with B0 inhomogeneity. However tailored multi-dimensional pulses tend to be very long in duration, which defeats some of the purpose of fast sequences like those associated with steady-state coherent MRI (e.g., TrueFISP).

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example systems and methods facilitate mitigating off-resonance angle in steady-state coherent MRI. Example systems and methods interact with a multi-channel transmission array (e.g., parallel transmission array) to address variations in B0 with RF using only a single dimensional pulse. Example systems and methods adjust the phase profile and amplitude of the RF field to fit the off-resonance angle map. Therefore, locations that include spins that conventionally would not have been excited may now experience some excitation. Since the spins experience excitation they may produce an NMR signal, which mitigates banding due to phase accumulation. In one example, banding may be eliminated.

Adjusting the phase profile is equivalent to defining the axis of rotation of the RF field. Example systems and methods interact with a multi-channel transmission array to create a phase profile that varies in space without using a multi-dimensional pulse. Conventional single channel transmitters can only create a phase profile that varies in space by using a multi-dimensional pulse. Recall that multi-dimensional pulses may be very long in duration, while a goal of steady-state coherent imaging is speed. Example systems and methods also interact with the multi-channel transmission array to modify the magnitude of the pulse to maintain a desired tip angle. Data from which the phase profile that varies in space and from which the modification of the magnitude of the pulse can be determined can be calculated from a B0 map and from coil sensitivity profiles. "B0 map", as used herein, refers to information about the static field associated with MRI. Thus, a B0 map may store, for example, a spatial map of static field strength, information concerning a set of resonant frequencies, and so on.

Example systems and methods may interact with the multi-channel transmitter and an MRI apparatus or an MRI simulation by providing sequences of RF pulses that compensate for phase accumulation and off-resonance angle.

A first RF pulse sequence used to mitigate phase accumulation in steady-state coherent MR imaging includes three pulses that may be referred to as a rewind pulse, an alpha pulse, and a pre-wind pulse. At the end of a repetition time (TR), the off-resonance angle defines that phase that spins in a voxel have accumulated. When this angle is known, the phase can be negated with the rewind pulse. The rewind pulse is configured to take spins in particular voxels where phase has accumulated and rotate them to a parallel orientation. Placing the spins back in the parallel orientation may be referred to as rewinding the magnetization. The alpha pulse then acts on the rewound magnetization. The alpha pulse rotates the spins about one axis and provides general excitation. The pre-wind pulse takes the excited magnetization and places spins in a properly pre-phased location so that at the time TE=TR/2 (TE=echo time, TR=repetition time) the spins are mutually aligned. Mutual alignment is a condition employed by the contrast mechanisms of steady-state coherent MR imaging techniques like TrueFISP. While the pre-wind pulse and the rewind pulse are similar, the pre-wind pulse acts on a different rotation axis.

In one example, the rewind pulse and the pre-wind pulse have spatially varying amplitude and phase. The spatially varying amplitude and phase may depend, for example, on the off-resonance angle. Therefore, a calibration phase may determine the off-resonance angle, the amount to which the amplitude will vary, and the amount to which the phase will vary. The spatially varying amplitude and phase associated with the rewind pulse and the pre-wind pulse may take advantage of the control that can be exercised on individual transmission channels on the multi-channel transmitter.

A second RF pulse sequence used to mitigate phase accumulation in steady-state coherent MRI includes two pulses that may be referred to as a de-excitation pulse and an excitation pulse. The excitation pulse operates at the beginning of a TrueFISP TR. The excitation pulse tips spins from the z axis into the transverse plane with proper pre-phasing in place. The de-excitation pulse operates at the end of a TrueFISP TR. At the end of the TR, the de-excitation pulse takes the spins and returns them to the z-axis. This includes spins and their accumulated off-resonance angles. In one example, in the presence of T1 decay, the magnitude of one of the pulses is adjusted to eliminate the bands associated with phase accumulation and off-resonance angles. For example, the de-excitation pulse may be reduced slightly. In one example, the de-excitation pulse is reduced by an amount equal to the amount of T1 decay. In another example, the de-excitation pulse is reduced by an amount that is a function of T1 decay.

In one example, the excitation pulse and the de-excitation pulse have spatially varying amplitude and phase. The spatially varying amplitude and phase may depend, for example, on the off-resonance angle. Therefore, a calibration phase may determine the off-resonance angle, the amount to which the amplitude will vary, and the amount to which the phase will vary. The spatially varying amplitude and phase associated with the excitation pulse and the de-excitation pulse may take advantage of the control that can be exercised on individual transmission channels on the multi-channel transmitter.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 1:
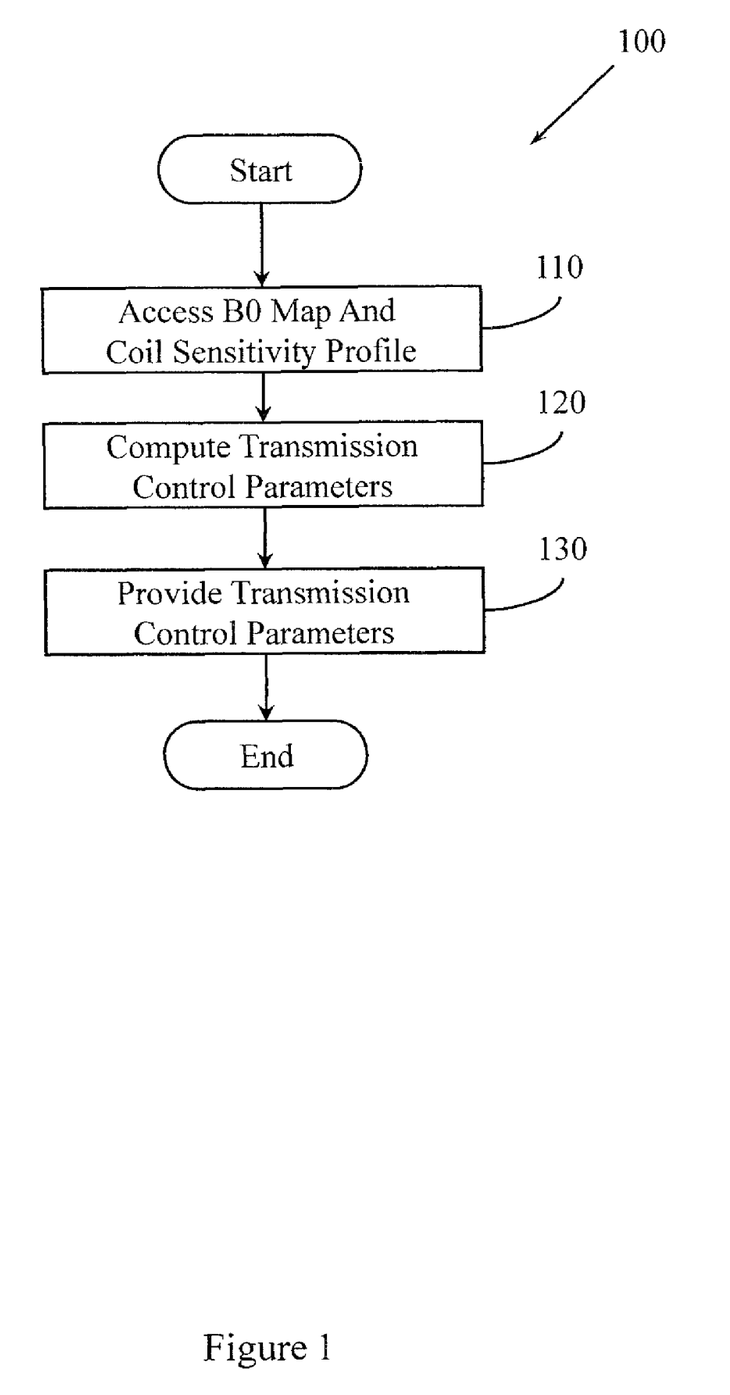
FIG. 1 illustrates an example method associated with mitigating off-resonance angle in steady-state coherent MRI.

FIG. 1 illustrates a method 100 associated with mitigating off-resonance angle in steady-state coherent MRI. Method 100 may include, at 110, accessing a B0 map and a coil sensitivity profile associated with an MRI apparatus. The MRI apparatus can produce a steady-state coherent MRI sequence to image an object. Method 100 interacts with an MRI apparatus that includes a multi-channel transmission array having individually controllable transmission channels.

Method 100 also includes, at 120, computing transmission control parameters for individual transmission channels of the multi-channel transmission array. In one example, the transmission control parameters are computed as a function of the B0 map and the coil sensitivity profile. The transmission control parameters facilitate controlling the multi-channel transmission array to create a spatially varying phase profile using a single dimensional RF pulse.

In one example, computing the transmission control parameters at 120 may include computing a pulse magnitude modification value as a function of the B0 map and the coil sensitivity profile. The pulse magnitude modification value can also be provided to an MRI apparatus, an MRI simulation, and so on. With the pulse magnitude modification value available, the method 100 may include controlling the MRI apparatus to maintain a desired tip angle by selectively modifying the pulse magnitude as a function of the modification value. The pulse magnitude modification value may be associated with accounting for T1 decay.

Method 100 also includes, at 130, providing the control parameters to the MRI apparatus, to an MRI simulation, and so on. The control parameters can then be used for in-vivo work or for simulation work. In one example the steady-state coherent MRI sequence is a TrueFISP sequence.

While FIG. 1 illustrates various actions occurring in serial, it is to be appreciated that various actions illustrated in FIG. 1 could occur substantially in parallel. By way of illustration, a first process could access a B0 map and coil sensitivity profiles while a second process could compute transmission control parameters and a third process could selectively provide the computed transmission control parameters to downstream consumers including, for example, an MRI apparatus, an MRI simulator, and so on. While three processes are described, it is to be appreciated that a greater and/or lesser number of processes could be employed and that lightweight processes, regular processes, threads, and other approaches could be employed.

Figure 2:
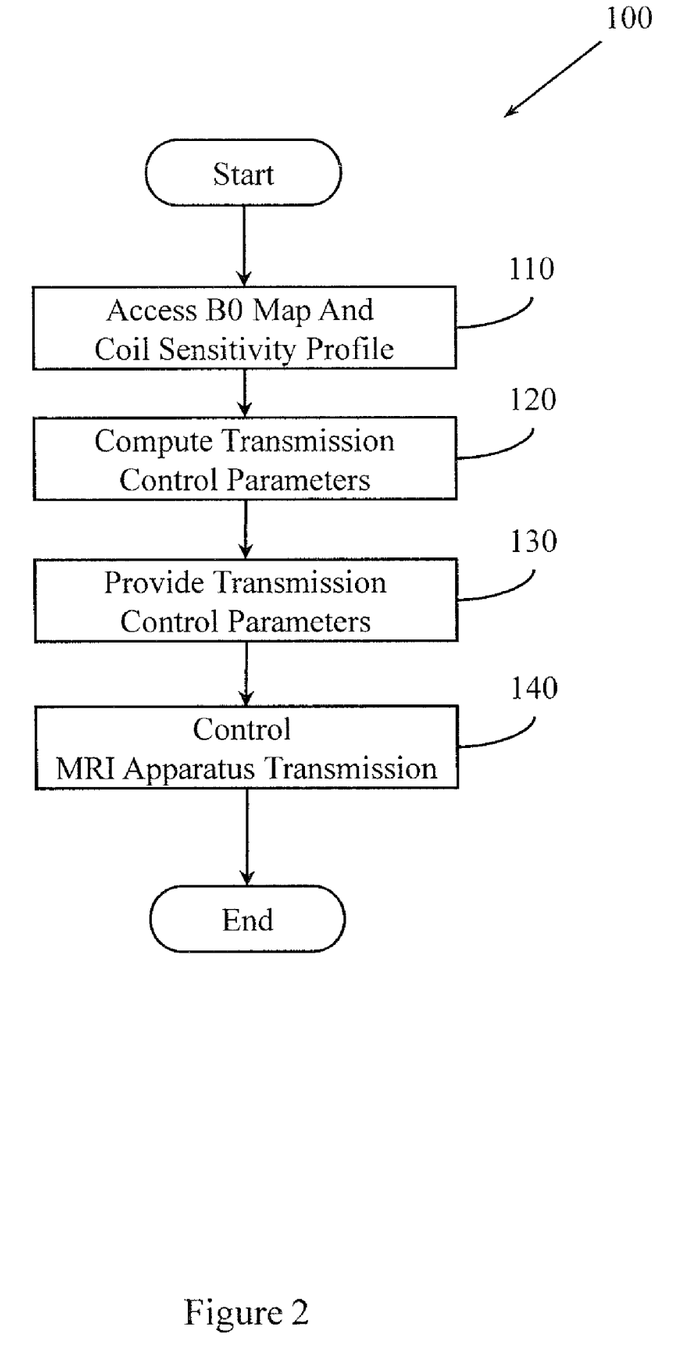
FIG. 2 illustrates an example method associated with mitigating off-resonance angle in steady-state coherent MRI.

FIG. 2 illustrates another embodiment of method 100. This embodiment includes, at 140, controlling the MRI apparatus to transmit RF energy comprising a single dimensional pulse through two or more of the individual transmission channels of the multi-channel transmission array. The RF energy is to be transmitted according to the transmission control parameters. This embodiment of method 100 is clearly tied to an MRI apparatus and causes a physical transformation because it causes an NMR signal to be emitted by a body exposed to the RF energy. The energy transmitted through the multi-channel transmission array facilitates mitigating off-resonance angle in steady-state coherent MRI by reacting to identified phase accumulation.

Figure 3:
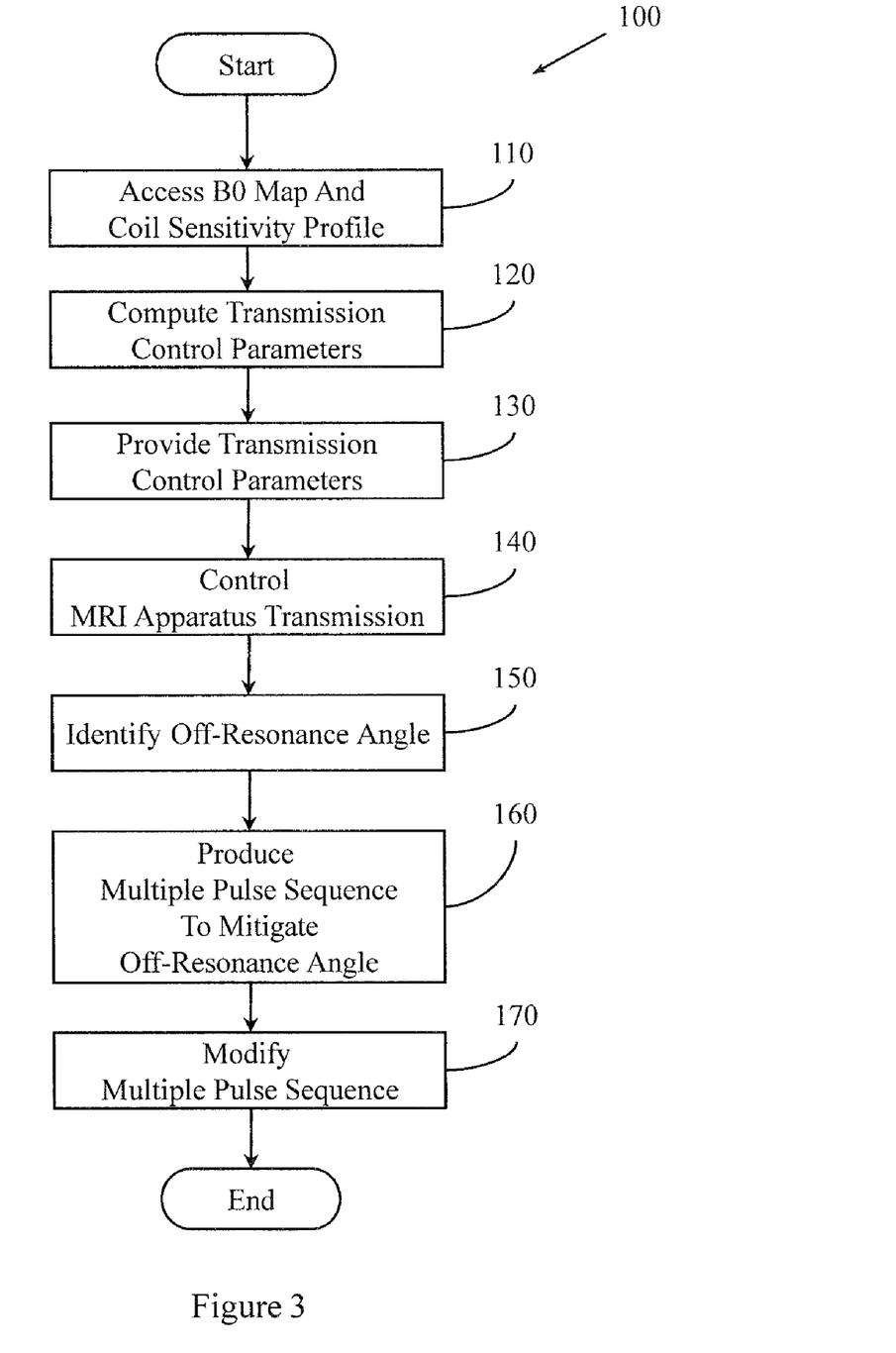
FIG. 3 illustrates an example method associated with mitigating off-resonance angle in steady-state coherent MRI.

FIG. 3 illustrates another embodiment of method 100. This embodiment includes, at 150, identifying an off-resonance angle produced in the object exposed to the steady-state coherent MRI sequence. The off-resonance angle defines phase accumulated by spins in a voxel in the object at the end of a TR. The off-resonance angle may be provided to an MRI apparatus, to an MRI simulator, and so on.

This embodiment of method 100 also includes, at 160, controlling the MRI apparatus to produce a multiple pulse sequence configured to compensate for phase accumulation and off-resonance angle produced as a result of the object being exposed to the steady-state coherent MRI sequence. The method 100 controls an MRI apparatus to produce the multiple pulse sequence for a TR of the steady-state coherent MRI sequence associated with exciting a voxel in the object. This multiple pulse sequence facilitates producing images that do not suffer banding from unexcited regions because regions that would not have been properly excited due to the phase accumulation will now be correctly excited because the phase accumulation has been dealt with.

In one example the multiple pulse sequence is a three pulse sequence. In this example, the three pulse sequence includes a first pulse, a second pulse, and a third pulse applied in order in the TR. The first pulse negates accumulated phase by rotating spins in the voxel to a parallel orientation to produce rewound magnetization in the voxel. The second pulse provides general excitation magnetization in the voxel by rotating, about one axis, spins associated with the rewound magnetization in the voxel. The third pulse places spins in the voxel associated with the general excitation in selected pre-phase locations so that spins in the voxel are mutually aligned at time TE=TR/2 in the TR.

In another example, the multiple pulse sequence is a two pulse sequence. The two pulse sequence includes a first pulse that occurs before the second pulse in the TR. The first pulse tips a set of spins associated with the object from the z-axis into the transverse plane with selected pre-phasing in place and the second pulse returns the set of spins with their accumulated off-resonance angles to the z-axis.

Both types of multiple pulse sequences may be modified as information about the off-resonance angle is acquired or refined. Thus, method 100 may also include, at 170, selectively modifying the amplitude and phase of a pulse in the multi-pulse sequence as a function of the off-resonance angle. In one example, the magnitude of a pulse is reduced as a function of T1 decay.

Figure 4:
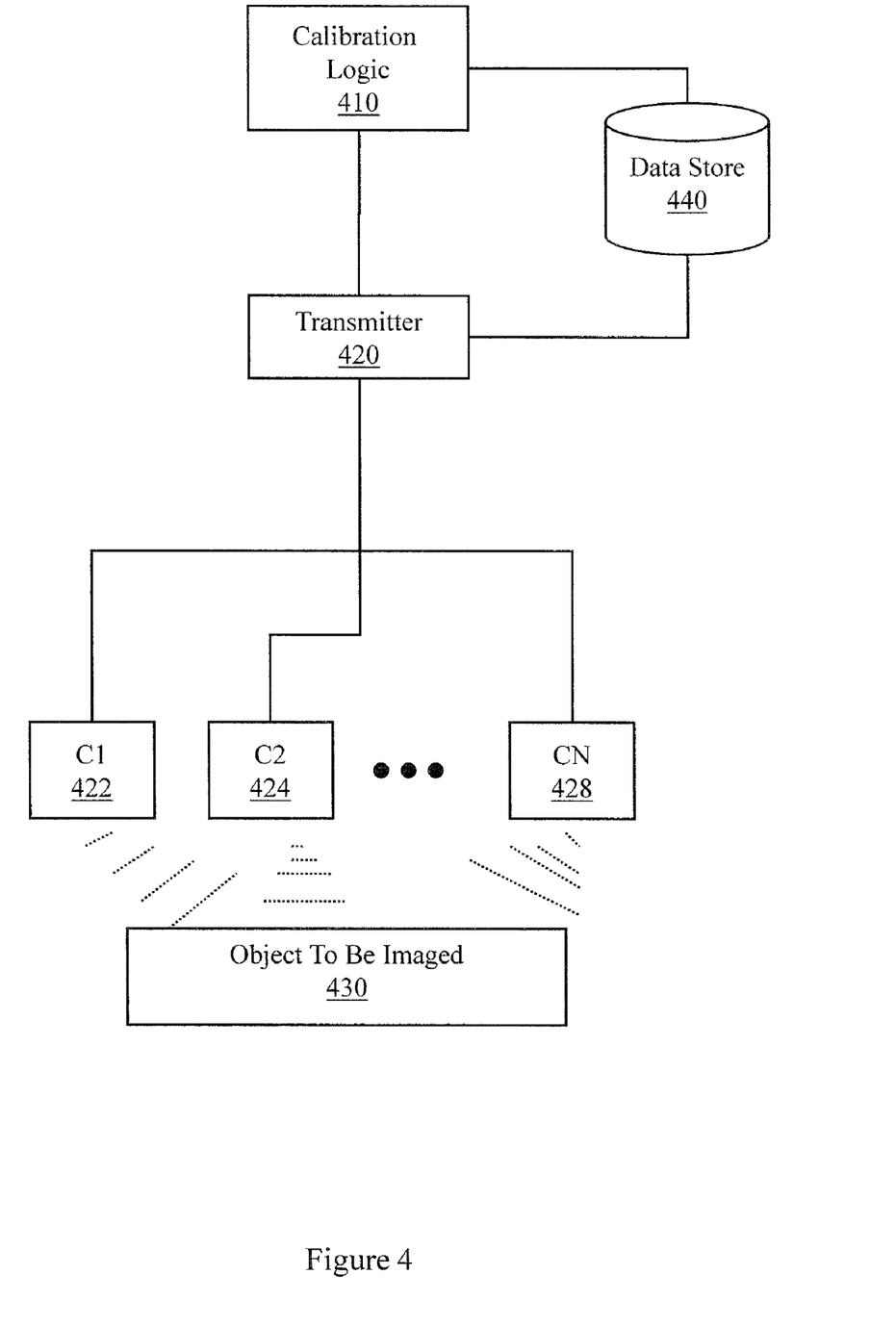
FIG. 4 illustrates an example apparatus associated with mitigating off-resonance angle in steady-state coherent MRI.

FIG. 4 illustrates an apparatus associated with mitigating off-resonance angle in steady-state coherent MRI. The apparatus includes a calibration logic 410. Calibration logic 410 is configured to determine calibration parameters for a transmitter 420 associated with an MR apparatus. The MRI apparatus is configured to produce a steady-state coherent MRI sequence. The transmitter 420 may include multiple individually controllable transmission channels (e.g., C1 422, and C2 424 through C3 428). The calibration parameters facilitate controlling the transmitter 420 to create a spatially varying phase profile using a single dimensional pulse. RF energy transmitted by the transmitter 420 may interact with an object to be imaged 430. The RF energy may cause the object 430 to emit an NMR signal.

The apparatus also includes a data store 440 to store the calibration parameters. In one example, the calibration parameters are determined as a function of a B0 map and a coil sensitivity profile associated with the MRI apparatus. The calibration parameters may be used, as described above and below, to control transmission of energy to produce a spatially varying field configured to mitigate phase accumulation and thus produce MR images that do not suffer from banding associated with phase accumulation and off-resonance angle.

Figure 5:
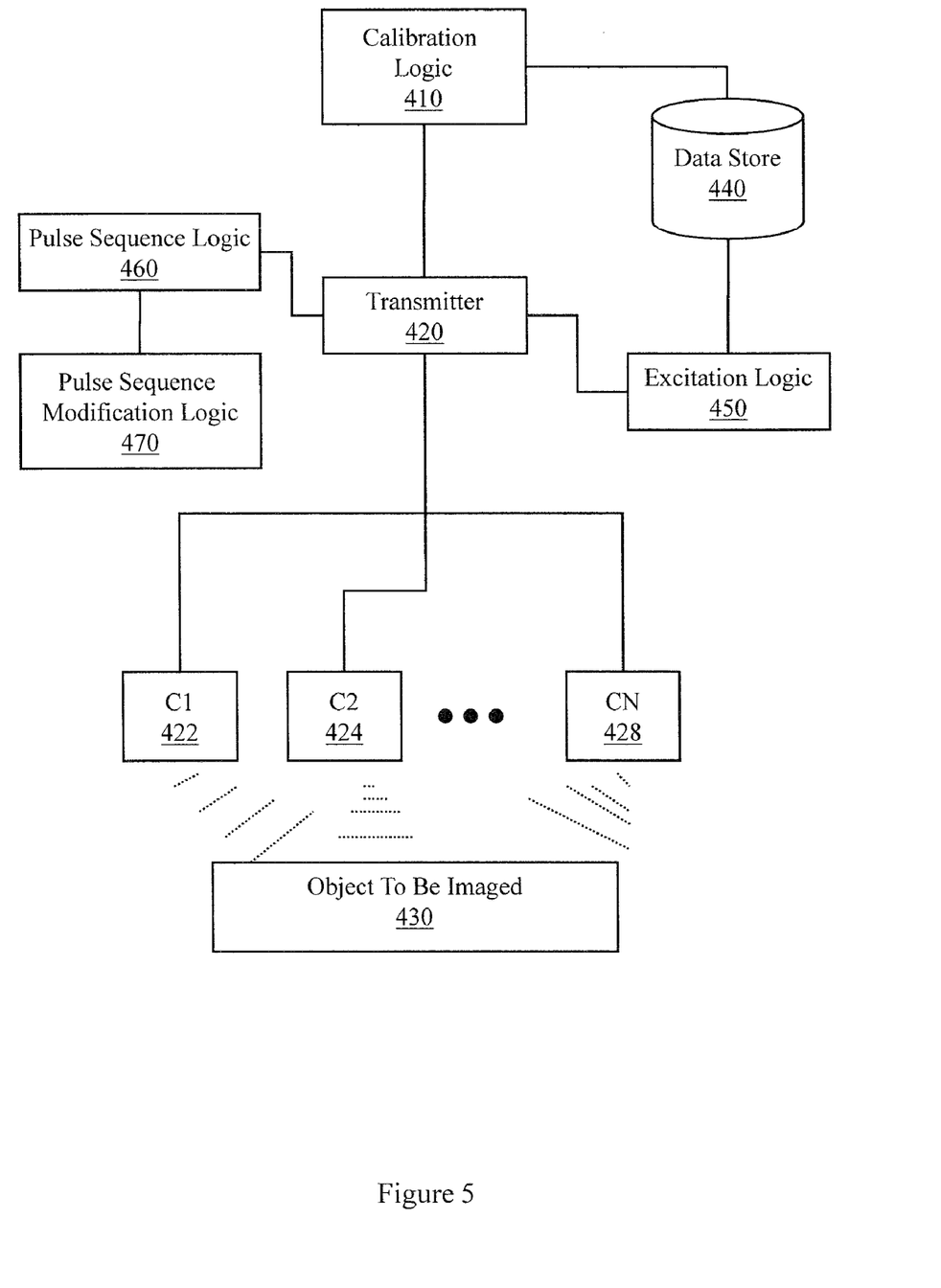
FIG. 5 illustrates an example apparatus associated with mitigating off-resonance angle in steady-state coherent MRI.

FIG. 5 illustrates another embodiment of the apparatus. This embodiment includes an excitation logic 450. The excitation logic 450 is configured to control the MRI apparatus to transmit RF energy comprising a single dimensional pulse through two or more of the individual transmission channels of the transmitter 420. The RF energy and the single dimensional pulse are based, at least in part, on the calibration parameters. Once again, the RF energy is intended to mitigate phase accumulation and thus reduce banding.

This embodiment also includes a pulse sequence logic 460. Pulse sequence logic 460 may produce pulse sequences having multiple pulses. For example, the pulse sequence logic 460 may produce a two pulse sequence, a three pulse sequence, and so on. The multiple pulse sequences are configured to compensate for phase accumulation and off-resonance angle produced as a result of the steady-state coherent MRI sequence.

Figure 7:
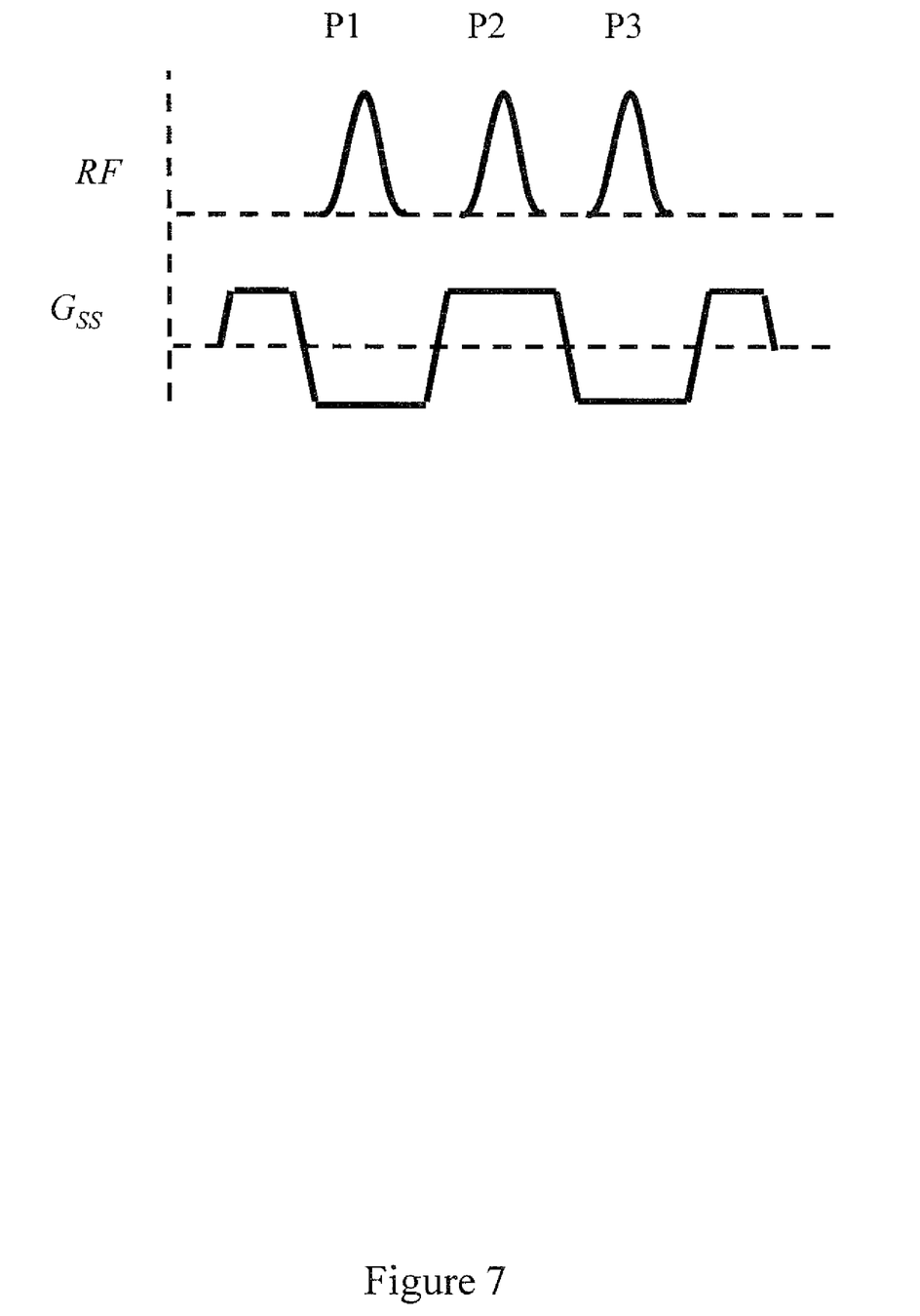
FIG. 7 illustrates a pulse sequence diagram showing a three pulse method for mitigating off-resonance angle in steady-state coherent MRI.

In one example, the multiple pulse sequence is a three pulse mitigation sequence. The MRI apparatus is to produce the three pulse sequence for a TR of the steady-state coherent MRI sequence associated with exciting a voxel in the object 430. The three pulse sequence includes a first pulse, a second pulse, and a third pulse applied in order in the TR. The first pulse negates accumulated phase by rotating spins in the voxel to a parallel orientation to produce rewound magnetization in the voxel. The second pulse provides general excitation magnetization in the voxel by rotating spins associated with the rewound magnetization in the voxel about one axis. The third pulse places spins in the voxel associated with the general excitation in selected pre-phase locations so that spins in the voxel are mutually aligned at time TE=TR/2 in the TR. FIG. 7 illustrates pulses P1, P2 and P3 associated with an example three pulse sequence. RF represents the radio frequency energy and GSS represents the gradient slice select.

Figure 8:
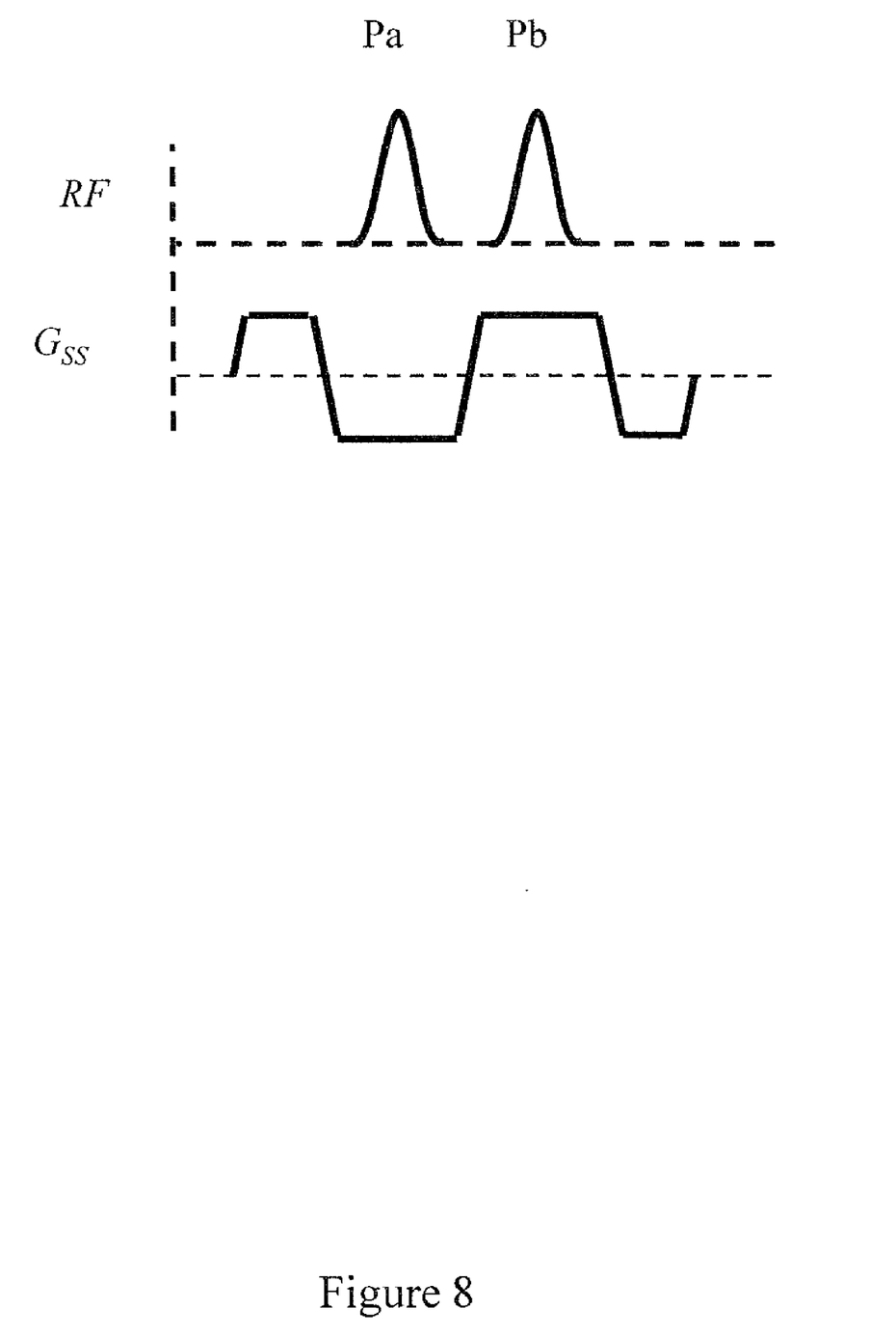
FIG. 8 illustrates a pulse sequence diagram showing a two pulse method for mitigating off-resonance angle in steady-state coherent MRI.

In another example, the multiple pulse sequence is a two pulse mitigation sequence. In this example the MRI apparatus is to produce the two pulse sequence for a TR of the steady-state coherent MRI sequence associated with exciting a voxel in the object 430. The first pulse occurs before the second pulse in the TR. The first pulse tips a set of spins associated with the object from the z-axis into the transverse plane with selected pre-phasing in place and the second pulse returns the set of spins with their accumulated off-resonance angles to the z-axis. FIG. 8 illustrates pulses Pa and Pb associated with an example two pulse sequence. RF represents the radio frequency energy and GSS represents the gradient slice select.

This embodiment also includes a pulse sequence modification logic 470. Logic 470 is configured to produce a modification to a multiple pulse mitigation sequence that is configured to compensate for phase accumulation and off-resonance angle produced as a result of the steady-state coherent MRI sequence. The pulse sequence modification logic 470 may modify the amplitude or the phase of a pulse of the multiple pulse mitigation sequence. The modifying may be based, at least in part, on the off-resonance angle. In one example, the pulse sequence modification logic 470 is configured to modify the magnitude of a portion of the multiple pulse mitigation sequence as a function of T1 decay.

Figure 6:
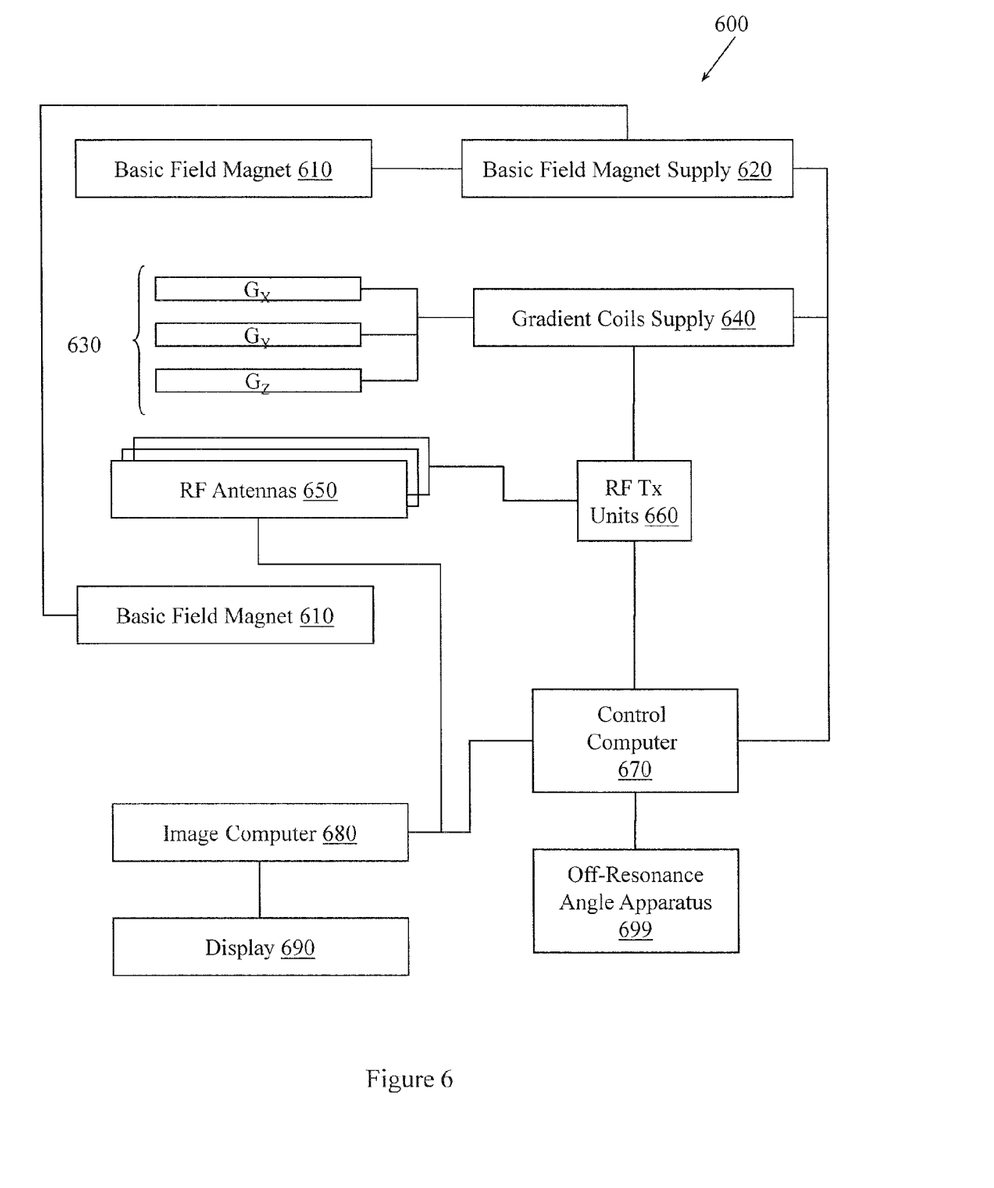
FIG. 6 illustrates an MRI apparatus configured with an apparatus for mitigating off-resonance angle in steady-state coherent MRI.

FIG. 6 illustrates an example MRI apparatus 600 configured with an off-resonance angle apparatus 699 that is configured to facilitate mitigating off-resonance angle in steady-state coherent MRI. The off-resonance angle apparatus 699 may be configured with elements of example apparatus described herein or may perform example methods described herein. The off-resonance angle apparatus 699 may provide means (e.g., hardware, software, firmware) for calibrating individual transmission channels in an MRI multi-channel transmitter with respect to creating a spatially varying phase profile using a single dimensional pulse. The calibration apparatus 699 may also provide means (e.g., hardware, software, firmware) for magnetic resonance imaging an object using a steady-state coherent MRI technique in conjunction with the spatially varying phase profile.

The apparatus 600 includes a basic field magnet(s) 610 and a basic field magnet supply 620. Ideally, the basic field magnets 610 would produce a uniform B0 field. However, in practice, the B0 field may not be uniform, and may vary over an object being imaged by the MRI apparatus 600. MRI apparatus 600 may include gradient coils 630 configured to emit gradient magnetic fields like $G_S$, $G_P$ and $G_R$. The gradient coils 630 may be controlled, at least in part, by a gradient coils supply 640. In some examples, the timing, strength, and orientation of the gradient magnetic fields may be controlled, and thus selectively adapted during an MRI procedure.

MRI apparatus 600 may include a set of RF antennas 650 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 650 may be controlled, at least in part, by a set of RF transmission units 660. An RF transmission unit 660 may provide a signal to an RF antenna 650.

The gradient coils supply 640 and the RF transmission units 660 may be controlled, at least in part, by a control computer 670. In one example, the control computer 670 may be programmed to control an IMRI device as described herein. The magnetic resonance signals received from the RF antennas 650 can be employed to generate an image and thus may be subject to a transformation process like a two dimensional FFT that generates pixilated image data. The transformation can be performed by an image computer 680 or other similar processing device. The image data may then be shown on a display 690. While FIG. 6 illustrates an example MRI apparatus 600 that includes various components connected in various ways, it is to be appreciated that other MRI apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium storing computer-executable instructions that when executed by the computer cause the computer to perform a method which mitigates the effects of off resonance angle, in steady-state coherent MRI sequences that image an object, the method comprising:

accessing a B0 map and a coil sensitivity profile associated with a magnetic resonance imaging (MRI) apparatus that is configured to produce a steady-state coherent MRI sequence in order to image an object, the MRI apparatus being configured with a multi-channel transmission array having independently and individually controllable transmission channels;

computing transmission control parameters associated with one of excitation and de-excitation for individual transmission channels of the multi-channel transmission array as a function of the B0 map and the coil sensitivity profile, where the transmission control parameters are configured to facilitate controlling the multi-channel transmission array to use a single dimensional radio frequency (RF) pulse in order to create a spatially varying phase profile;

providing the control parameters to one or more of, the MRI apparatus, and an MRI simulation;

controlling the MRI apparatus in order to transmit RF energy comprising a single dimensional pulse through two or more of the individual transmission channels of the multi-channel transmission array according to the transmission control parameters;

identifying an off-resonance angle produced by the steady-state coherent MRI sequence, where the off-resonance angle defines phase accumulated by spins in a voxel in the MRI imaged object at the end of a repetition time (TR); and providing the off-resonance angle to one or more of, the MRI apparatus and an MRI simulation of an MRI imaged object;

compensating for phase accumulation and off-resonance angle produced as a result of the steady-state coherent MRI sequence by producing a multiple pulse mitigation modification to the steady-state coherent MRI sequence where the modification comprises modifying one or more of, the amplitude, and the phase of one pulse of the multiple pulse mitigation sequence as a function of the identified off-resonance angle.

2. The non-transitory computer-readable medium of claim 1, the method comprising:

computing a pulse magnitude modification value as a function of the B0 map and the coil sensitivity profile; and providing the pulse magnitude modification value to one or more of, the MRI apparatus, and the MRI simulation.

3. The non-transitory computer-readable medium of claim 2, the method comprising:

controlling the MRI apparatus to maintain a desired tip angle by selectively modifying the pulse magnitude as a function of the modification value.

4. The non-transitory computer-readable medium of claim 1, the method comprising: controlling the MRI apparatus to produce a three pulse sequence configured to compensate for phase accumulation and off-resonance angle produced as a result of the steady-state coherent MRI sequence, where the MRI apparatus is to produce the three pulse sequence for a TR of the steady-state coherent MRI sequence associated with exciting a voxel in the object;

where the three pulse sequence includes a first pulse, a second pulse, and a third pulse applied in order in the TR, where the first pulse is configured to negate accumulated phase by rotating spins in the voxel to a parallel orientation to produce rewound magnetization in the voxel;

where the second pulse provides general excitation magnetization in the voxel by rotating, about one axis, spins associated with the rewound magnetization in the voxel; and where the third pulse places spins in the voxel associated with the general excitation in selected pre-phase locations so that spins in the voxel are mutually aligned at time TE=TR/2 in the TR, where TR represents repetition time and TE represents echo time.

5. The non-transitory computer-readable medium of claim 4, the method comprising selectively modifying the amplitude and phase of one or more of the first pulse and the third pulse as a function of the off-resonance angle.

6. The non-transitory computer-readable medium of claim 5, where the magnitude of one or more of the first pulse and the third pulse is reduced as a function of T1 decay.

7. The non-transitory computer-readable medium of claim 1, the method comprising: controlling the MRI apparatus to produce a two pulse sequence configured to compensate for phase accumulation and off-resonance angle produced as a result of the steady-state coherent MRI sequence, where the MRI apparatus is to produce the two pulse sequence for a TR of the steady-state coherent MRI sequence associated with exciting a voxel in the object;

where the two pulse sequence includes a first pulse, and a second pulse, the first pulse occurring before the second pulse in the TR, where the first pulse is configured to tip a set of spins associated with the object from the z-axis into the transverse plane with selected pre-phasing in place, where the second pulse is configured to return the set of spins with their accumulated off-resonance angles to the z-axis, and where TR represents repetition time.

8. The non-transitory computer-readable medium of claim 7, the method comprising selectively modifying the amplitude and phase of one or more of the first pulse and the second pulse as a function of the off-resonance angle.

9. The non-transitory computer-readable medium of claim 8, where the magnitude of one or more of the first pulse and the second pulse is reduced as a function of T1 decay.

10. The non-transitory computer-readable medium of claim 1, the steady-state coherent MRI sequence being a TrueFISP sequence.

11. An apparatus compatible with the magnetic resonance imaging of an object, comprising:

a calibration logic configured to determine calibration parameters utilized by a transmitter associated with an MRI apparatus configured to image an object, the calibration logic being configured to produce a steady-state coherent MRI sequence, the transmitter comprising two or more independently and individually controllable transmission channels, where the calibration parameters associated with one of excitation and de-excitation are configured to facilitate controlling the transmitter in order to use a single dimensional radio frequency (RF) pulse to create a spatially varying phase profile;

a data store storing the calibration parameters;

where the calibration parameters are determined as a function of a B0 map and a coil sensitivity profile associated with the MRI apparatus;

an excitation logic configured to control the MRI apparatus in order to transmit RF energy comprising a single dimensional pulse through two or more of the individual transmission channels of the transmitter as a function of the calibration parameters;

a pulse sequence modification logic configured to produce a modification to a multiple pulse mitigation sequence and configured to compensate for phase accumulation and off-resonance angle produced as a result of the steady-state coherent MRI sequence, where the modification comprises modifying one or more of, the amplitude and the phase, of one pulse, of the multiple pulse mitigation sequence as a function of the off-resonance angle; and the apparatus being incorporated into the MRI apparatus that is configured to image an object.

12. The apparatus of claim 11, comprising a pulse sequence logic configured to produce a three pulse mitigation sequence configured to compensate for phase accumulation and off-resonance angle produced as a result of the steady-state coherent MRI sequence, where the MRI apparatus is configured to produce the three pulse sequence for a TR of the steady-state coherent MRI sequence associated with exciting a voxel in the object;

where the three pulse sequence includes a first pulse, a second pulse, and a third pulse applied in order in the TR, where the first pulse is configured to negate accumulated phase by rotating spins in the voxel to a parallel orientation in order to produce rewound magnetization in the voxel;

where the second pulse provides general excitation magnetization in the voxel by rotating, about one axis, spins associated with the rewound magnetization in the voxel; and where the third pulse places spins in the voxel associated with the general excitation in selected pre-phase locations so that spins in the voxel are mutually aligned at time TE=TR/2 in the TR, where TR represents repetition time and TE represents echo time.

13. The apparatus of claim 11, comprising a pulse sequence logic configured to produce a two pulse mitigation sequence configured to compensate for phase accumulation and off-resonance angle produced as a result of the steady-state coherent MRI sequence, where the MRI apparatus is configured to produce the two pulse sequence for a TR of the steady-state coherent MRI sequence associated with exciting a voxel in the object;

where the two pulse sequence includes a first pulse, and a second pulse, the first pulse occurring before the second pulse in the TR, where the first pulse is configured to tip a set of spins associated with the object from the z-axis into the transverse plane with selected pre-phasing in place, where the second pulse is configured to return the set of spins with their accumulated off-resonance angles to the z-axis, and where TR represents repetition time.

14. The apparatus of claim 11, the pulse sequence modification logic being configured to modify the magnitude of a portion of the multiple pulse litigation sequence as a function of T1 decay.

* * * * *